United States Patent [19]
Felcman et al.

[11] Patent Number: 5,692,208
[45] Date of Patent: Nov. 25, 1997

[54] LEVER APPARATUS FOR AN EJECTOR MECHANISM IN A PERSONAL COMPUTER

[75] Inventors: Chris F. Felcman, Spring; Patrick V. Illingworth, Tomball; Michael V. Leman, Spring, all of Tex.

[73] Assignee: Compaq Computer Corporation, Houston, Tex.

[21] Appl. No.: 418,814

[22] Filed: Apr. 7, 1995

[51] Int. Cl.[6] .................................................. G06F 1/16
[52] U.S. Cl. ..................... 395/800; 361/683; 312/9.29; 364/224.4; 364/231; 364/DIG. 1
[58] Field of Search ................................ 395/800, 822, 395/828, 892; 361/679, 683, 684, 685, 686; 312/9.19, 9.29, 270.1, 270.2, 275, 249.1, 294

[56] References Cited

U.S. PATENT DOCUMENTS

| | | | |
|---|---|---|---|
| 4,982,303 | 1/1991 | Krenz | 360/137 |
| 5,283,714 | 2/1994 | Tsai et al. | 361/683 |
| 5,319,519 | 6/1994 | Sheppard et al. | 361/685 |
| 5,321,962 | 6/1994 | Ferchau et al. | 70/208 |
| 5,422,785 | 6/1995 | Garrett et al. | 361/684 |
| 5,492,480 | 2/1996 | Fusselman et al. | 439/157 |
| 5,495,391 | 2/1996 | Kirk | 361/684 |
| 5,509,731 | 4/1996 | Callahan et al. | 312/9.22 |

*Primary Examiner*—Alpesh M. Shan
*Attorney, Agent, or Firm*—Konneker & Smith

[57] ABSTRACT

The present invention provides a lever apparatus for use in a personal computer that has a chassis with a wall and an interior portion that contains a frame configured to retain an ejectable structure therein. The frame has an ejector mechanism associated therewith for ejecting an ejectable structure therefrom, and the lever apparatus actuates the ejector mechanism to eject the ejectable structure from the frame. The lever apparatus comprises an elongated body pivotally that is coupled to the wall and that has an axis of rotation with respect to the wall. The elongated body may be pivotally coupled to the wall by a pin and hinge member The elongated body has a digit contact end external to the interior portion and an oppositely disposed cam end operable against the ejector mechanism. The cam end exerts a leverage force against the ejector mechanism when the elongated body is pivoted from a non-engaged position to an engaged position, to thereby eject the ejectable structure from the frame.

31 Claims, 3 Drawing Sheets

LEVER APPARATUS FOR AN EJECTOR MECHANISM IN A PERSONAL COMPUTER

BACKGROUND OF THE INVENTION

1. Field of the Invention

The present invention is directed, in general, to computer apparatus having a PCMCIA frame structure with an ejector mechanism associated therewith, and more particularly relates to a lever apparatus for actuating the ejector mechanism.

2. Description of Related Art

The use of and advantages associated with portable computers are well known in the art. Over the last decade, there has been an intense effort in the computer industry to down size the personal computer ("PC") to provide users with a powerful yet portable computer that can be taken out of the office and fully utilized at home or on the road. As advancements have been made in both microprocessing chip and battery technologies, particularly over the last decade, PCs were eventually downsized into "laptop computers". While these computers offered the portability and processing power of a full sized PC, the laptop was still somewhat large and heavy for the user to carry around. In response to these disadvantages, the laptops were downsized even further into what is now known in the industry as a notebook computer, which is smaller and more light weight yet possessing equal or greater processing capabilities than their earlier laptop counterpart.

In order to achieve a useful portable computer in the size of the notebook computers presently known in the art, many design processing and space saving changes occurred both in the electronics portion of the computer and in the exterior design. However, while the size of these portable computers has decreased, the expectations of the user with respect to the processing capacity and interfacing capabilities have expanded.

Thus, to accommodate this expanding need for a "super" portable computer, portable computer memory card international association ("PCMCIA") cards, which are small expansion modules each roughly the size and shape of a credit card, have been developed. These PCMCIA cards allow the user to temporarily expand the processing or interfacing capabilities of a portable computer with the insertion of a single card into the computer and interfacing it with the motherboard in the computer. Several different types of PCMCIA cards are presently available to portable computer users. These PCMCIA cards are often used in conjunction with a computer to easily, rapidly and interchangeably add various operational capabilities to the computer such as additional memory, enhanced video characteristics, networking or a fax/modem. For instance, some PCMCIA cards have been designed to allow the user to increase the RAM processing memory of the personal computer or interface the personal computer with varying types of Networks systems, such as Local Area Networks ("LAN"). Other PCMICA cards, alternatively, have been designed to operate as a modem or even has a supplemental hard disk drive. These and other various types of PCMCIA cards are now commercially available and extensively used.

Typically, a PCMCIA card is insertable through an exterior housing side wall slot of the computer into an interior housing card chamber within which a PCMCIA frame having an ejector mechanism associated therewith is positioned. The inner end of the inserted card is forcibly plugged into and electrically connected with a complementary pin connector portion of the PCMCIA frame that is, in turn, electrically connected to the computer system planar or motherboard.

Generally, most PCMCIA cards have 68 connector pins, which create a substantial retention force once the card is inserted in the frame. Thus, various mechanical devices with varying actuating mechanisms have been devised to overcome this substantial retention force and eject the PCMCIA card from the frame. Many such actuating mechanisms include spring biased depressible buttons positioned adjacent the PCMCIA slot and on the exterior housing side wall. These depressible actuating mechanisms are typically coaxial with an actuating arm of the ejector mechanism, and thus, exert a force that is substantially proportional to the force exerted against the button. The force acts linearly against the actuating arm of the ejector mechanism; that is, each pound of card disconnection force requires that a pound of actuation force be manually exerted on the movable plate member. While such mechanisms do accomplish the function of ejecting the PCMCIA card from the computer, there are certain disadvantages associated with their use. For example, the buttons are typically small and difficult for the user to easily reach, even with a single digit (i.e. finger). Once reached, however, the user must press sufficiently hard to over come the retention force of the multi-pin PCMCIA card. Because of the previously discussed linear relationship, ejecting the PCMCIA card from the computer can sometimes be rather difficult.

Other actuating devices include a simple handle extending from the side of the actuating arm to allow the user to activate the ejector mechanism with a digit. Again, there is no amplification of the force (i.e., each pound of card disconnection force requires that a pound of actuation force be manually exerted on the movable plate member) exerted by this type of device and the user must, therefore, exert substantial force against the handle to actuate the ejector mechanism.

Another type of card ejector mechanism, commonly referred to as a "bottom actuated" ejector, comprises a movable plate member, which underlies the inserted PCMCIA card and may be manually pulled to engage the card, disconnect it from its associated planar board pin connector structure, and outwardly move an end portion of the disconnected card through its housing slot where it may be manually grasped and pulled to complete the removal of the card from the computer's interior. While of a relatively simple design, this type of card ejector mechanism has the disadvantage of having no force amplification.

Accordingly, what is needed in the art is a simple lever apparatus for actuating a PCMCIA ejector mechanism that is simplistic in design, readily accessible and one that provides an amplification of leverage force to easily eject a PCMCIA card from a PCMCIA slot in a personal computer.

SUMMARY OF THE INVENTION

To address the above-discussed deficiencies of the prior art, the present invention provides a lever apparatus for use in a personal computer having a chassis with a wall and an interior portion. The chassis' interior portion contains a frame that is configured to retain an ejectable structure therein. The frame has an ejector mechanism associated therewith for ejecting the ejectable structure therefrom. The lever apparatus actuates the ejector mechanism to eject the ejectable structure from the frame. The lever apparatus comprises an elongated body that is pivotally coupled to the wall and has an axis of rotation with respect to the wall. The elongated body has a cam end on its end that engages the ejector mechanism.

Preferably, the elongated body is pivotally coupled to the wall by a pin member having a first end coupled to the wall and a second end extending through an aperture formed in the elongated body member adjacent the cam end. More preferably, however, the elongated body is pivotally coupled to the wall by a pin and hinge assembly. In a preferred embodiment, the pin and hinge assembly are positioned in a lever apparatus opening in the wall wherein the cam end extends through the lever apparatus opening into the interior portion of the chassis when the elongated body is in an engaging position.

The elongated body has a digit contact end external to the interior portion that is oppositely disposed from the cam end. The contact end may have an arcuate shape for allowing a user to easily grasp the contact end. The cam end is preferably a planar member projecting perpendicularly from the elongated body toward the interior portion of the chassis. When the elongated body is pivoted from a non-engaged position to an engaged position, the cam end exerts a leverage force against the ejector mechanism thereby to eject the ejectable structure from the frame. Preferably, the elongated body exerts a leverage forcing having a force vector direction perpendicular with respect to the axis of rotation.

In another aspect of the embodiment just discussed, the elongated body may further comprise a flexible latch integral with and projecting from a side of the elongated body. The flexible latch is registered to be resiliently received by a corresponding latch opening formed in the wall of the chassis when the elongated body is in the non-engaged position, to thereby securely hold the elongated body against the wall.

In a more preferred embodiment, the lever apparatus comprises a plurality of vertically stacked, horizontal, elongated bodies pivotally coupled to the wall of the chassis along a common rotational axis that are operational against a plurality of vertically stacked frames with associated ejector mechanisms.

In yet another embodiment, the elongated body has an arcuate intermediate portion between the cam end and the contact end. In this particular embodiment, the elongated body is pivotally coupled to the wall in the interior portion of the chassis, and the cam end is a cylindrical member that projects perpendicularly from the elongated body within the interior portion of the chassis when the elongated body is in a non-engaged position.

In yet another embodiment of the present invention, there is provided a personal computer, preferably a portable computer. The personal computer comprises a chassis that has a side wall and an interior portion for housing electrical and mechanical components therein. The chassis further has a lever apparatus opening formed in the side wall.

The personal computer further includes a frame positioned within the interior portion that is configured to retain an ejectable structure therein. In a preferred embodiment, the frame is a PCMCIA frame and the ejectable structure is a PCMCIA ejectable structure wherein the PCMCIA frame is configured to receive the PCMCIA ejectable structure therein. The frame has an ejector mechanism associated therewith for ejecting the ejectable structure from the frame. The ejector mechanism has an actuating arm for actuating the ejector mechanism. Preferably, the ejector mechanism is a PCMCIA ejector configured to eject the ejectable structure from the frame when the actuating arm is actuated.

The personal computer of the present invention also includes an elongated body pivotally coupled to and having an axis of rotation with respect to the side wall. The personal computer preferably comprises a plurality of vertically stacked, horizontal, elongated bodies pivotally coupled to the side wall of the chassis having a common rotational axis. When a plurality of these elongated bodies are present, they are operational against a plurality of vertically stacked frames and associated ejector mechanisms. The elongated body may be pivotally coupled to the side wall by a pin member having a first end coupled to the side wall and a second end extending through an aperture formed in the elongated body member adjacent the cam end. More preferably, however, the elongated body is pivotally coupled to the side wall by a pin and hinge assembly.

In a preferred embodiment, the hinge assembly is comprised of coaxially aligned first and second bearing sections coupled together by an intermediate bearing section. The first bearing section is a generally cylindrical hollow portion of the side wall, and the second bearing section is formed by an opening in a portion of a grounding plate positioned within the interior portion of the chassis. The intermediate bearing section is a passageway extending through the elongated body adjacent the cam end. The first, second and intermediate sections receive a pin therethrough, to thereby pivotally couple the lever apparatus to the chassis.

In a more preferred embodiment, the elongated body is pivotally coupled to the side wall by a pin and hinge assembly positioned in a lever apparatus opening in the side wall wherein the cam end extends through the lever apparatus opening into the interior portion of the chassis when the elongated body is in an engaging position.

The body has a digit contact end external to the interior portion and an oppositely disposed cam end operable against the actuating arm. Preferably, the contact end is arcuate and the cam end is a planar member that projects perpendicularly from the elongated body and extends toward the interior portion of the chassis when the elongated body is in a non-engaged position. When the elongated body is pivoted from a non-engaged position to an engaged position, the cam end exerts a leverage force against the actuating arm, thereby to eject the ejectable structure from the frame. Preferably, the elongated body exerts a leverage force having a direction force vector perpendicular with respect to the axis of rotation.

In another aspect of this embodiment, the elongated body further comprises a flexible latch integral with and projecting from a side of the elongated body, and the chassis further includes a corresponding latch opening formed in the side wall adjacent the lever apparatus opening. The flexible latch is registered to be received by the corresponding latch opening when the elongated body is in the non-engaged position, to thereby securely hold the elongated body against the side wall.

In another embodiment of the present invention, there is provided a personal computer comprising a chassis having a side wall and an interior portion for housing electrical and mechanical components therein. The chassis further has a cylindrical pin secured to the side wall within the interior portion of the chassis. Preferably, the cylindrical pin projects perpendicularly from an interior side of the side wall into the interior portion of the chassis. The personal computer also includes a frame positioned within the interior portion that is configured to retain an ejectable structure therein. Preferably, the frame is a PCMCIA frame and the ejectable structure is a PCMCIA ejectable structure wherein the PCMCIA frame is configured to receive the PCMCIA ejectable structure therein. The frame has an ejector mechanism associated therewith for ejecting the ejectable structure from the frame. Associated with the ejector mechanism is an actuating arm for actuating the ejector mechanism. Preferably, the ejector mechanism is a PCMCIA ejector that is configured to eject the ejectable structure from the frame when the actuating arm is actuated by operation of the lever apparatus.

An elongated body that is pivotally coupled to the chassis by the cylindrical pin is also present in this particular embodiment. Preferably, the elongated body is pivotally coupled to the side wall within the interior portion of the chassis. The elongated body is rotatable with respect to the side wall and has a digit contact end that is external to the interior portion of the chassis and an oppositely disposed cam end operable against the actuating arm. The cam end engages and exerts a leverage force against the actuating arm when the elongated body is pivoted from a non-engaged position to an engaged position to thereby eject the ejectable structure from the frame. Preferably, the elongated body exerts a leverage force in a direction that is perpendicular with respect to the axis of rotation. The elongated body preferably has an arcuate intermediate portion between the cam end and the contact end, which effectively multiplies the leverage force. The cam end is preferably a cylindrical member projecting perpendicularly from the elongated body within the interior portion of the chassis.

In the preferred embodiment just described, the cylindrical pin is coupled to the side wall and a extends through an aperture formed in the elongated body member adjacent the cam end.

The foregoing has outlined rather broadly the features and technical advantages of the present invention so that the detailed description of the invention that follows may be better understood. Additional features and advantages of the invention will be described hereinafter which form the subject of the claims of the invention. Those skilled in the art should appreciate that they can readily use the disclosed conception and specific embodiment as a basis for designing or modifying other structures for carrying out the same purposes of the present invention. Those skilled in the art should also realize that such equivalent constructions do not depart from the spirit and scope of the invention as broadly defined.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION

Figure 1:
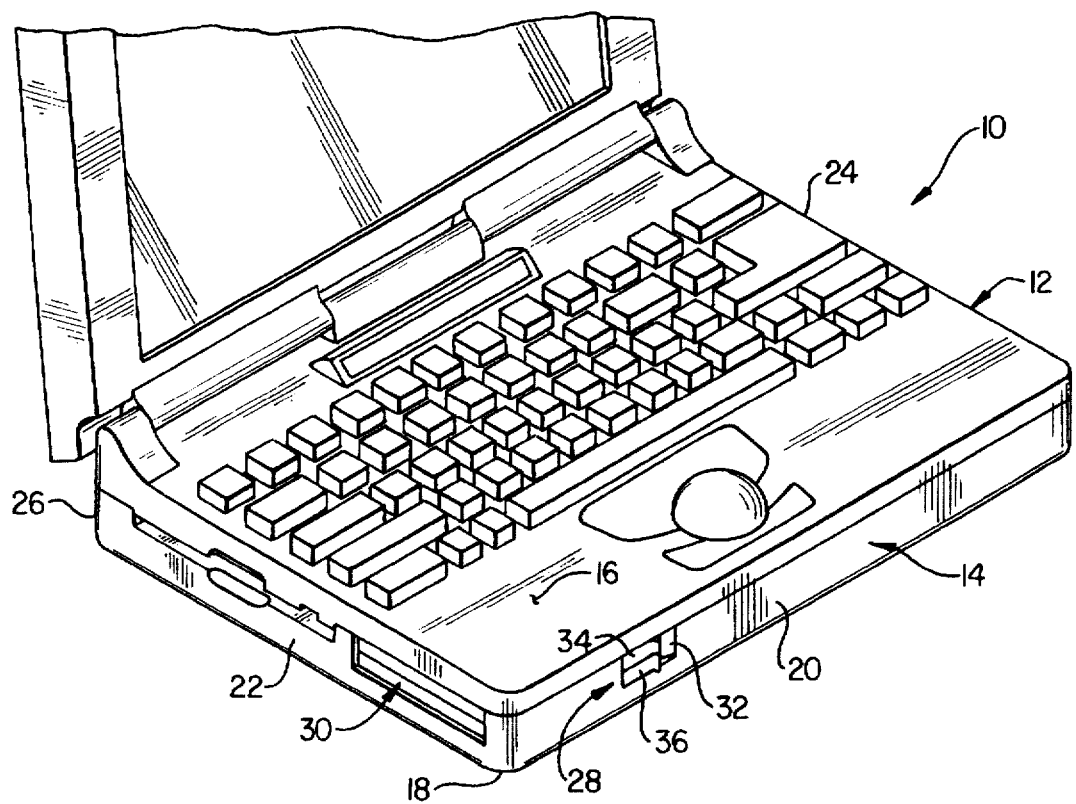
FIG. 1 illustrates a perspective view of a personal portable computer incorporating the lever apparatus of the present invention with a pair of lever apparatus, both of which are in the non-engaged position.

Referring initially to FIG. 1, in a preferred embodiment thereof, illustrated is a perspective view of a portable computer 10 having a chassis 12 for containing electrical components therein. Of course, it will be appreciated that the lever apparatus as generally described below may have application personal computers of all types, including desktops and personal digital assistants. The chassis 12 has a wall 14, which preferably is comprised of a top wall 16, a bottom wall 18 and opposing side walls 20,22,24 and 26. A lever apparatus 28 of the present invention is preferably positioned on the side wall 20 of the chassis 12 adjacent the adjoining side wall 22 in which a portable computer memory card international association (PCMCIA) card slot 30 is formed for receiving an ejectable structure, such as a PCMCIA card, therethrough. As will be later described below, the lever apparatus 28 is positioned and designed to actuate an ejector mechanism (not shown) within the chassis 12 and eject the ejectable structure (not shown) from the chassis 12.

The side wall 20 on which the lever apparatus 28 is positioned preferably has a gently furrowed-out portion 32 which allows the lever apparatus 28 to be flush with the outer side surface of the side wall 20 when the lever apparatus 28 is in a non-engaged position but yet provides sufficient space for a user to easily grasp the end of and rotate the lever apparatus 28. As illustrated, there is a plurality of vertically stacked, horizontally positioned lever apparatus 34,36 pivotally coupled to the side wall 20 of the chassis 12 along a common rotational axis for actuating a plurality of vertically stacked ejector mechanisms (not shown). It will, of course, be appreciated that a single lever apparatus 36 could also be employed when only one ejector mechanism is positioned within the interior of the chassis 12.

Figure 2:
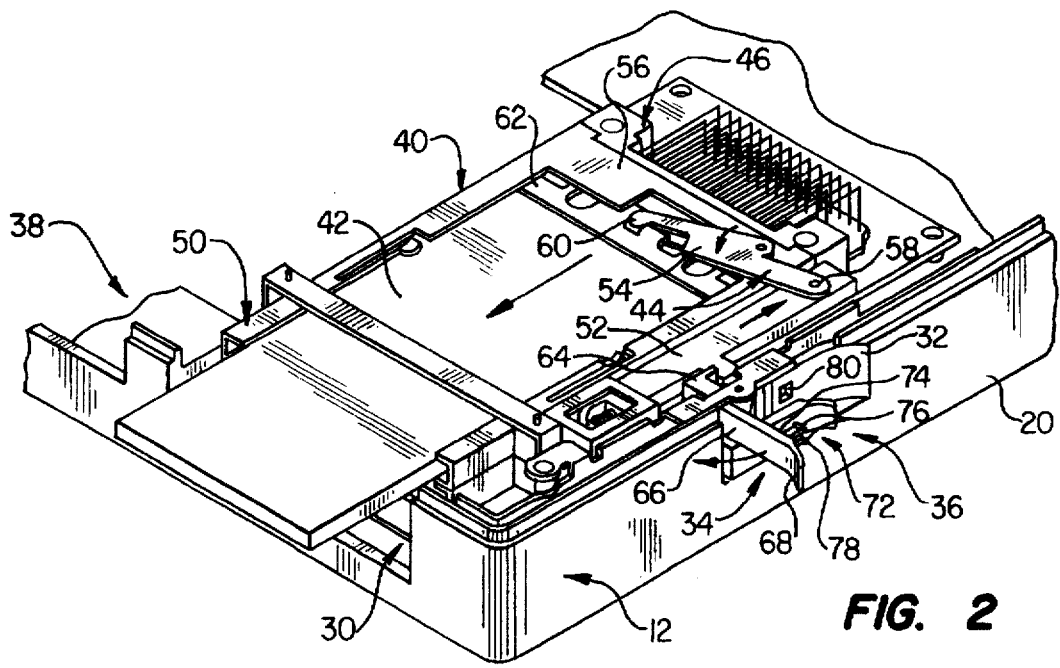
FIG. 2 illustrates a partial perspective view of the interior of the personal portable computer of FIG. 1 with one pair of the lever apparatus in a non-engaged position and the other in an engaged position acting against an ejector mechanism.

Turning now to FIG. 2, there is illustrated a partial interior perspective view of the personal portable computer 10 of FIG. 1 showing the lever apparatus 36 in a non-engaged position and the lever apparatus 34 pivoted 90° to an engaged position. As illustrated, the chassis 12 has an interior portion 38 in which a frame 40 is positioned for holding an ejectable structure 42 therein. The frame 40 is preferably a conventional PCMCIA frame having a 68 insertion pin configuration (not shown) and having a conventional ejector mechanism 44 associated therewith for retaining and ejecting the ejectable structure 42 from the frame 40. The frame 40 has a first interior end 46 that is electrically connected to a motherboard (not shown) and an oppositely disposed second end 50 that extends toward the slot 30. The length of the frame 40 is such that the second end 50 terminates within the interior portion 38 of the portable computer 10 adjacent the slot 30.

The conventional ejector mechanism 44 includes a spring biased actuating arm 52 that, when activated, causes the ejector mechanism 44 to partially eject the ejectable structure 42 from the frame 40, and thus, from the interior portion 38 of the portable computer 10. Preferably, the ejectable structure 42 is a 68 insertion pin Type I, II or III PCMCIA structure card device, such as a network card, modem card, memory card, external disk drive, etc. that is configured to be inserted into the frame 40 through the slot 30. The actuating arm 52 is positioned on the frame 40 immediately adjacent the wall 20 of the portable computer 10 on which the lever apparatus 28 is positioned and extends a substantial length of the frame 40 as illustrated.

A flat metallic planar lever member 54 is pivotally coupled to a top planar portion 56 approximate the midpoint of the planar lever member 54. The planar lever member 54 has a first end 58 that is also pivotally coupled to the actuating arm 52 adjacent the interior end 46 of the frame 40. The flat, planar lever member 54 further has a second end 60 that is slidably coupled to a thin planar ejector plate 62. As the lever apparatus 28 is rotated 90° to an engaged position, the lever apparatus 28 engages an actuating projection 64 of the actuating arm 52, thereby exerting a leverage force against the actuating arm 52. The actuating arm 52 is thus moved toward the interior end 46 of the frame 40, as indicated, thereby pivoting the planar lever member 54 with respect to the top planar portion 56 and causing the second end 60 of the planar lever member 54 to move in a direction substantially opposite that of the actuating arm 52. The motion of the second end 60 moves the ejector plate 62 against the edge of the ejectable structure 42 in a direction opposite that of the actuating arm 52. The ejector plate 62 thereby partially ejects the ejectable structure 42 from the frame 40 and outwardly through the slot 30 such that the user may then grasp the ejectable structure 42 and remove it entirely from the chassis 12.

The lever apparatus 28 is preferably comprised of a generally rectangular elongated body 66 pivotally coupled to and having an axis of rotation with respect to the wall to which the elongated body 66 is pivotally attached. The elongated body 66 has a digit contact end 68 external to the chassis 12 that allows the user to easily grasp the elongated body 66 for rotation. On the end opposing the digit contact end 68, there is a cam end 70, which is operable against the ejector mechanism 44. The cam end 70 exerts a leverage force against the ejector mechanism 44 when the cam end 44 contacts the actuating arm 52 as the elongated body 66 is pivoted 90° from a non-engaged position to an engaged position. Preferably, the force vector exerted against the actuating arm 52 by the cam end 70 has a direction that is perpendicular with respect to the axis of rotation of the elongated body 66 about the wall 20. The cam end 70 may contact the actuating arm 52 directly, or it may contact the actuating arm 52 indirectly via an intermediate member positioned between the cam end 70 and the actuating arm 52.

The contact end 68 of the elongated body 66 preferably has an arcuate shape to allow the user to easily grasp and rotate the elongated body 66. The cam end 70, on the other hand, is a generally rectangular planar member projecting perpendicularly from the elongated body 66 toward the interior portion 38 of the chassis 12 when the elongated body 66 is in a non-engaged position. In a preferred embodiment, the cam end 70 does not extend into the interior portion 38 when the elongated body 66 is in a non-engaged position. However, in alternate embodiments, the cam end 70 may extend into the interior portion 38 when the elongated body 66 is in a non-engaged position, provided the cam end 70 does not extend excessively into the interior portion 38 to make the lever apparatus 28 inoperable against the actuating arm 52.

The transverse configuration of the rotatable elongated body 66 and the cam end 70 provides a functioning lever that amplifies the force exerted by the elongated body 66 against the actuating arm 52 to thereby more easily overcome the retention force of the 68 pin configuration and eject the ejectable structure 42 from the frame 40.

The elongated body 66 may also include a flexible latch 72 integral with and projecting from an interior side 74 of the elongated body 66. The flexible latch 72 is preferably comprised of two projection members 76 each have latching tabs 78 on their outer sides. The projection members 76 are registered to be resiliently and removably received by a corresponding latch opening 80 formed in the wall 20 of the chassis 12 when the elongated body 66 is in the non-engaged position. When the flexible latch 72 is engaged with the latch opening 80, the elongated body 66 is securely held against the wall 20 of the chassis 12, which protects the elongated body 66 from physical damage when not in use.

Figure 3:
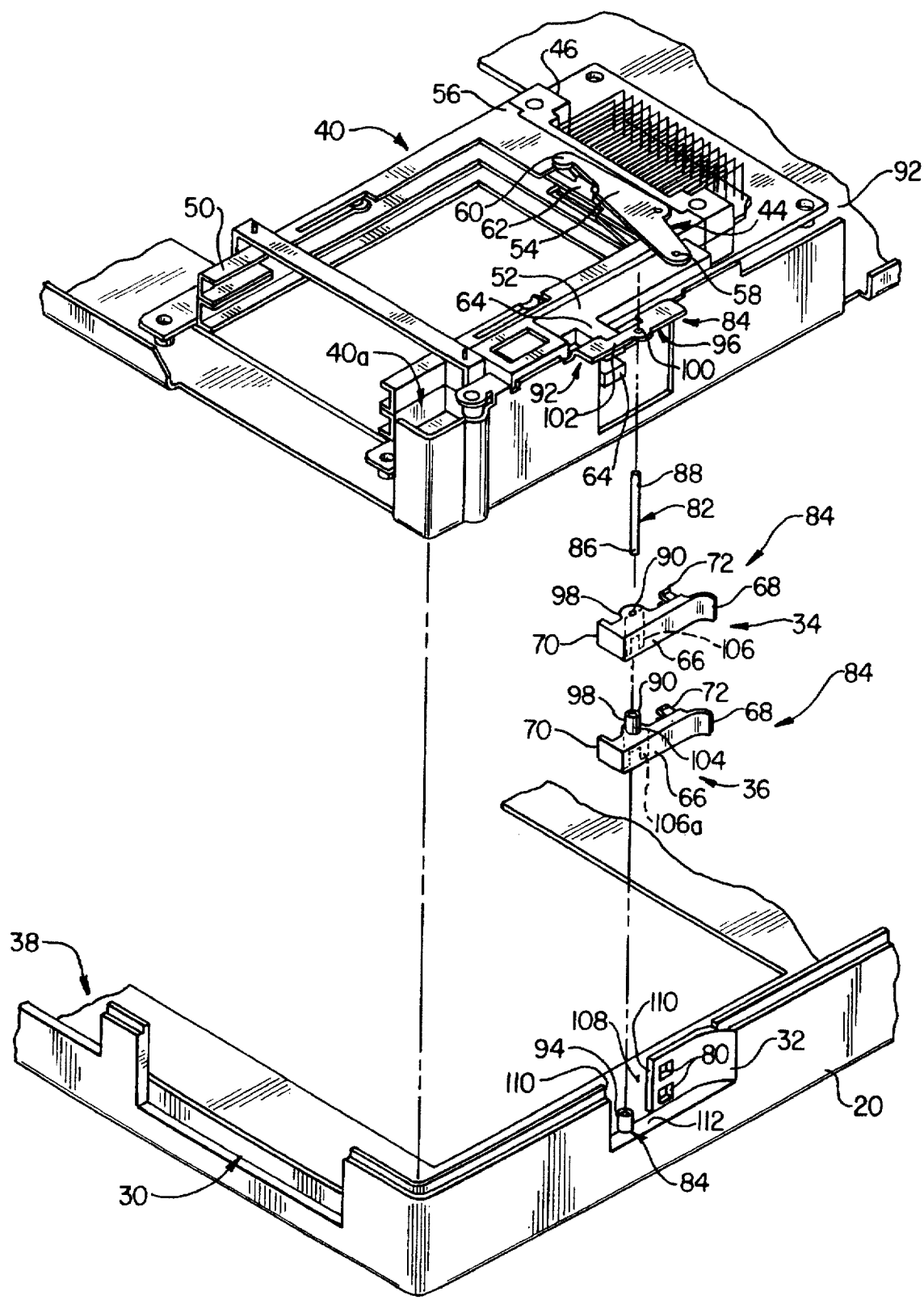
FIG. 3 illustrates an exploded view of FIG. 2 showing the pin and hinge assembly of members comprising the lever apparatus of the present invention.

Turning now to FIG. 3, there is illustrated, in a preferred embodiment thereof, an exploded view of the lever apparatus 28 of the present invention further comprising a pin 82 and hinge assembly 84. In a preferred embodiment, the elongated body 66 is pivotally coupled to the wall 60 by the pin member 82. The pin member 82 has a first end 86 coupled to the wall 20 and an oppositely disposed second end 88 extending through a pin passageway 90 formed in the elongated body member 66 adjacent the cam end 70. The second end 88 of the pin 82 may also be coupled to the wall 20.

In a more preferred embodiment, however, the elongated body 66 is coupled to the wall 20 by the pin 82 and hinge assembly 84. While the pin 82 is preferably a conventional bossa pin, the hinge assembly is unique in that it incorporates a ground shield 92 as part of the hinge assembly 84, and the elongated body 66 serves as part of the bearing for holding the pin 82 in proper alignment. The hinge assembly 84 is preferably comprised of coaxially aligned first and second bearing sections 94,96 coupled together by an intermediate bearing section 98. The first bearing section 94 is a generally hollow cylinder integrally formed in the side wall 20. The second bearing section 96 is comprised of an opening 100 in a tabular portion 102 of the grounding plate 92. The intermediate bearing section 96 is comprised of the passageway 90 that extends through the elongated bodies 66 adjacent the cam end 70, as illustrated.

When two elongated bodies 66 are present, the passageway 90 preferably extends through a generally hollow cylindrical member 104 that is integrally formed on and extends vertically and perpendicular with respect to the elongated body 66 on the lower lever 36 with the remainder of the passageway 90 extending through the other elongated body 66 of the upper lever 34. The cylindrical member 104 is received in a receiving cavity 106, shown in phantom, in lever 34, and the first bearing section 94 is also received in a receiving cavity 106a, shown in phantom, in lever 36 to coaxially align the passageways in levers 34 and 36.

The first, second and intermediate sections 94,96,98 removably receive the pin 82 therethrough, to thereby pivotally couple the upper and lower levers 34,36 to the chassis 12. The first end 86 of the pin 82 is received in the first bearing section 94 and the second end 88 is received through the opening 100 formed in the tabular portion 102 of the grounding plate 92. When properly aligned, the vertically stack levers 34 and 36 are respectively operable against the vertically stacked frame members 40 and 40a.

The first bearing section 94 may be formed in a lever apparatus opening 108 having opposing inwardly facing side surfaces 110 and a bottom side surface 112 from which the first bearing section 94 extends vertically. Similarly, the ground plate 92 may have a corresponding lever apparatus opening 108a configured to align with the lever apparatus opening 108 when the ground plate 92 is properly positioned within the interior portion 38 of the chassis 12. The position of the elongated body 66 within the lever apparatus openings 108 allows the cam end 70 to easily extend through the lever apparatus openings 108 and 108a into the interior portion 38 and engage the actuating arm 52 when the elongated body 66 is pivoted to the engaged position.

Figure 4:
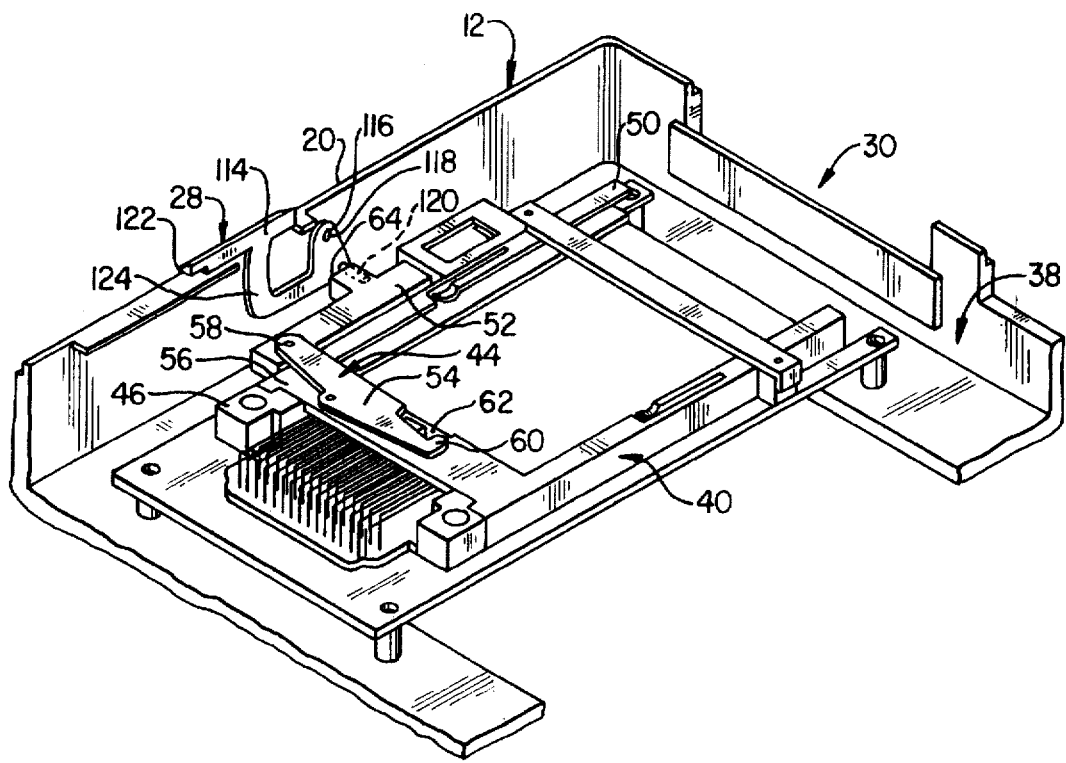
FIG. 4 illustrates an alternate embodiment of the lever apparatus of the present invention pivotally coupled to the side wall of the chassis within the interior portion of the chassis and in a non-engaged position.

Turning now to FIG. 4, there is illustrated the computer chassis 12 and an alternate embodiment of the lever apparatus 28 of the present invention in a non-engaged position. Positioned within the interior portion 38 of the computer chassis 12 is the previously described frame 40 and associated ejector mechanism 44. In this embodiment, the lever apparatus 28 is pivotally coupled to the side wall 20 of the chassis 12 within the interior portion 38. The lever apparatus 28 is comprised of an elongated body 114 that is pivotally coupled to the chassis 12 by a cylindrical pin 116 integrally formed with the side wall 20, which extends perpendicularly from the side wall 20 into the interior 38 of the chassis 12. The cylindrical pin 116 extends through a pin opening 118 formed through the lever apparatus 28 adjacent a cam end 120 thereof (shown in phantom). Thus, the elongated body 114 is rotatable with respect to and about the side wall 20.

The elongated body 114 further comprises a digit contact end 122 that is oppositely disposed from the cam end 120. Additionally, the elongated body 114 has an arcuate intermediate portion 124 between the cam end 120 and the elongated body 114. The cam end 120 is preferably a cylindrical member projecting perpendicularly from the arcuate intermediate portion 124 toward the interior portion 38 of the chassis 12 and is operable against the actuating arm 52 of the ejector mechanism 44. In contrast to the previous embodiments described above, the cam end 120 is positioned within the interior portion 38 of the chassis 12 when the lever apparatus 28 is in a non-engaged position.

Figure 5:
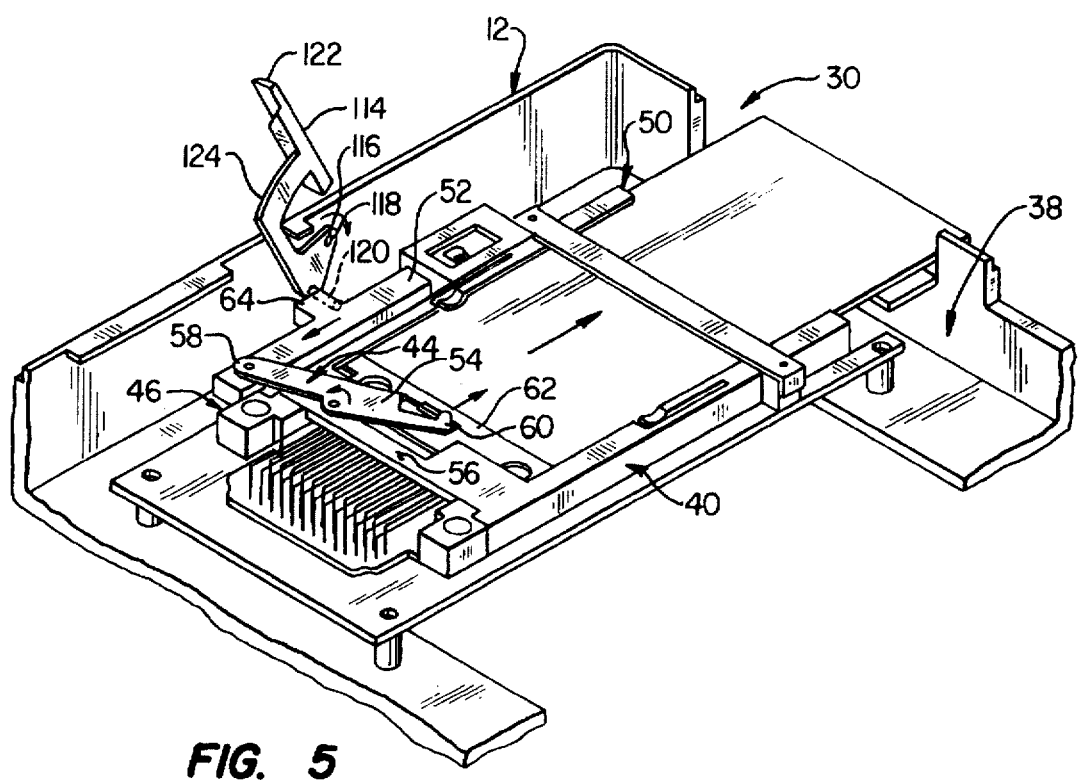
FIG. 5 illustrates the lever apparatus of FIG. 4 in the engaged position.

Turning now briefly to FIG. 5 there is illustrated the lever apparatus of FIG. 4 in an engaged position. As the elongated body 114 is rotated approximately 90° from a non-engaged position to an engaged position, the cam end 120 engages and exerts a leverage force against the actuating arm 52 via the actuating projection. The force vector exerted by the can end 120 is in a direction perpendicular with respect to the axis of rotation. As the lever apparatus 28 is rotated 90° to an engaged position, the cam end 120 engages the actuating projection 64 of the actuating arm 52, thereby exerting a leverage force against the actuating arm 52. The actuating arm 52 is thus moved toward the interior end 46 of the frame 40, as indicated, thereby pivoting the planar lever member 54 with respect to the top planar portion 56 and causing the second end 60 of the planar lever member 54 to move in a direction substantially opposite that of the actuating arm 52. The motion of the second end 60 moves the ejector plate 62 against the edge of the ejectable structure 42 in a direction opposite that of the actuating arm 52. The ejector plate 62 thereby partially ejects the ejectable structure 42 from the frame 40 and outwardly through the slot 30 such that the user may then grasp the ejectable structure 42 and remove it entirely from the chassis 12.

From the above description, it is apparent that the present invention provides a lever apparatus that is simplistic in design, readily accessible and one that provides an amplification of leverage force to actuate a PCMCIA ejector mechanism to easily eject a PCMCIA card from a PCMCIA slot in a personal computer. The lever apparatus actuates, via a force exerted against the actuating arm, the ejector mechanism to eject the ejectable structure from the PCMCIA frame. The lever apparatus comprises an elongated body that is pivotally coupled to the wall and that has an axis of rotation with respect to the wall. The elongated body is pivotally coupled to the wall by a pin member having a first end coupled to the wall and a second end extending through an aperture formed in the elongated body member adjacent the cam end. More preferably, however, the elongated body is pivotally coupled to the wall by a pin and hinge assembly. In a preferred embodiment, the pin and hinge assembly are positioned in a lever apparatus opening in the wall wherein the cam end extends through the lever apparatus opening into the interior portion of the chassis when the elongated body is in an engaging position. The hinge assembly is comprised of a coaxially aligned first and second bearing sections coupled together by an intermediate bearing section. The first bearing section is a generally cylindrical hollow portion of integrally formed from the side wall. The second bearing section is formed by an opening in a tabular portion of the grounding plate, which is positioned within the interior portion of the chassis. The intermediate bearing section is a passageway extending through the elongated body adjacent the cam end. The cam end exerts a leverage force against the ejector mechanism when the elongated body is pivoted from a non-engaged position to an engaged position, to thereby eject the ejectable structure from the frame.

Although the present invention and its advantages have been described in detail, it should be understood that various changes, substitutions and alterations can be made herein without departing from the spirit and scope of the invention as broadly defined.

What is claimed is:

1. For use in a personal computer having a chassis with a wall and an interior portion and containing a frame configured to retain an ejectable structure therein, said frame having an ejector mechanism associated therewith for ejecting said ejectable structure therefrom, a lever apparatus for actuating said ejector mechanism to eject said ejectable structure from said frame, said lever apparatus comprising:

an elongated body pivotally coupled to and having an axis of rotation with respect to said wall, said elongated body having a digit contact end external to said interior portion and an oppositely disposed cam end operable against said ejector mechanism, said cam end exerting a leverage force against said ejector mechanism when said elongated body is pivoted from a non-engaged position to an engaged position, to thereby eject said ejectable structure from said frame.

2. The lever apparatus of claim 1 wherein said elongated body is pivotally coupled to said wall by a pin member, said pin member having a first end coupled to said wall and a second end extending through an aperture formed in said elongated body member adjacent said cam end.

3. The lever apparatus of claim 1 wherein said elongated body further comprises a flexible latch integral with and projecting from a side of said elongated body, said flexible latch registered to be resiliently and removably received by a corresponding latch opening formed in said wall of said chassis when said elongated body is in said non-engaged position, to thereby securely hold said elongated body against said wall.

4. The lever apparatus of claim 1 wherein said elongated body has an arcuate intermediate portion between said cam end and said contact end.

5. The lever apparatus of claim 1 wherein said elongated body is pivotally coupled to said wall by a pin and hinge assembly.

6. The lever apparatus of claim 1 wherein said elongated body is pivotally coupled to said wall by a pin and hinge assembly positioned in a lever apparatus opening in said wall, said cam end extending through said lever apparatus opening into said interior portion of said chassis when said elongated body is in an engaging position.

7. The lever apparatus of claim 1 further comprising a plurality of vertically stacked, horizontal, elongated bodies pivotally coupled to said wall of said chassis along a common rotational axis.

8. The lever apparatus of claim 1 wherein said contact end is arcuate and said cam end is a planar member projecting perpendicularly from said elongated body toward said interior portion of said chassis.

9. The lever apparatus of claim 1 wherein said elongated body is pivotally coupled to said wall in said interior portion of said chassis.

10. The lever apparatus of claim 9 wherein said cam end is a cylindrical member projecting perpendicularly from said elongated body within said interior portion of said chassis when said elongated body is in a non-engaged position.

11. The lever apparatus of claim 1 wherein said elongated body exerts a leverage force having a direction perpendicular with respect to said axis of rotation.

12. A personal computer, comprising:

a chassis having a side wall and an interior portion for housing electrical and mechanical components therein, said chassis further having a lever apparatus opening formed in said side wall;

a frame positioned within said interior portion and configured to retain an ejectable structure therein, said frame having an ejector mechanism associated therewith for ejecting said ejectable structure from said frame, said ejector mechanism having an actuating arm for actuating said ejector mechanism; and an elongated body pivotally coupled to and having an axis of rotation with respect to said side wall, said elongated body having a digit contact end external to said interior portion and an oppositely disposed cam end operable against said actuating arm, said cam end exerting a leverage force against said actuating arm when said elongated body is pivoted from a non-engaged position to an engaged position to thereby eject said ejectable structure from said frame.

13. The lever apparatus of claim 12 wherein said elongated body is pivotally coupled to said side wall by a pin member, said pin member having a first end coupled to said side wall and a second end extending through an aperture formed in said elongated body member adjacent said cam end.

14. The lever apparatus of claim 12 wherein said elongated body further comprises a flexible latch integral with and projecting from a side of said elongated body and said chassis includes a corresponding latch opening formed in said side wall adjacent said lever apparatus opening, said flexible latch registered to be resiliently and removably received by said corresponding latch opening when said elongated body is in said non-engaged position, to thereby securely hold said elongated body against said side wall.

15. The lever apparatus of claim 12 wherein said elongated body is pivotally coupled to said side wall by a pin and hinge assembly.

16. The lever apparatus of claim 15 wherein said hinge assembly is comprised of coaxially aligned first and second bearing sections coupled together by an intermediate bearing section, said first bearing section being a generally cylindrical hollow portion of said side wall, said second bearing section formed by an opening in a portion of a grounding plate positioned within said interior portion, and said intermediate bearing section being a passageway extending through said elongated body adjacent said cam end, said first, second and intermediate sections receiving a pin therethrough, to thereby pivotally couple said elongated body to said chassis.

17. The lever apparatus of claim 16 wherein said elongated body is pivotally coupled to said side wall by a pin and hinge assembly positioned in said lever apparatus opening in said side wall, said cam end extending through said lever apparatus opening into said interior portion of said chassis when said elongated body is in an engaging position.

18. The lever apparatus of claim 12 further comprising a plurality of vertically stacked, horizontal, elongated bodies pivotally coupled to said side wall of said chassis having a common rotational axis.

19. The lever apparatus of claim 12 wherein said contact end is arcuate and said cam end is a planar member projecting perpendicularly from said elongated body and extending toward said interior portion of said chassis when said elongated body is in a non-engaged position.

20. The lever apparatus of claim 12 wherein said frame is a PCMCIA frame and said ejectable structure is a PCMCIA ejectable structure, said PCMCIA frame configured to receive said PCMCIA ejectable structure therein.

21. The lever apparatus of claim 12 wherein said ejector mechanism is a PCMCIA header ejector configured to eject said ejectable structure from said frame when said actuating arm is actuated.

22. The lever apparatus of claim 12 wherein the said elongated body exerts a leverage force having a direction perpendicular with respect to said axis of rotation.

23. The lever apparatus of claim 12 wherein said chassis is a portable computer chassis.

24. A personal computer, comprising:

a chassis having a side wall and an interior portion for housing electrical and mechanical components therein, said chassis further having a cylindrical pin secured to said side wall within said interior portion;

a frame positioned within said interior portion and configured to retain an ejectable structure therein, said frame having an ejector mechanism associated therewith for ejecting said ejectable structure from said frame, said ejector mechanism having an actuating arm for actuating said ejector mechanism; and an elongated body pivotally coupled to said chassis by said cylindrical pin, said elongated body being rotatable with respect to said side wall, said elongated body having a digit contact end external to said interior portion and an oppositely disposed cam end operable against said actuating arm, said cam end engaging and exerting a leverage force against said actuating arm when said elongated body is pivoted from a non-engaged position to an engaged position to thereby eject said ejectable structure from said frame.

25. The lever apparatus of claim 24 wherein said cylindrical pin has a first end coupled to said side wall and a second end extending through an aperture formed in said elongated body member adjacent said cam end.

26. The lever apparatus of claim 24 wherein said elongated body has an arcuate intermediate portion between said cam end and said contact end.

27. The lever apparatus of claim 24 wherein said cam end is a cylindrical member projecting perpendicularly from said elongated body within said interior portion of said chassis.

28. The lever apparatus of claim 24 wherein said frame is a PCMCIA frame and said ejectable structure is a PCMCIA ejectable structure, said PCMCIA frame configured to receive said PCMCIA ejectable structure therein.

29. The lever apparatus of claim 24 wherein said ejector mechanism is a PCMCIA header ejector configured to eject said ejectable structure from said frame when said actuating arm is actuated.

30. The lever apparatus of claim 24 wherein the said elongated body exerts a leverage force having a direction perpendicular with respect to said axis of rotation.

31. The lever apparatus of claim 24 wherein said cylindrical pin projects into said interior portion in a direction perpendicular with respect to said side wall.

* * * * *